(12) United States Patent
Kim et al.

(10) Patent No.: US 9,406,734 B2
(45) Date of Patent: Aug. 2, 2016

(54) FOLDABLE DISPLAY DEVICE

(71) Applicant: SAMSUNG DISPLAY CO., LTD., Yongin, Gyeonggi-Do (KR)

(72) Inventors: Dong-Wook Kim, Yongin (KR); Kwang-Min Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 66 days.

(21) Appl. No.: 14/163,125

(22) Filed: Jan. 24, 2014

(65) Prior Publication Data

US 2014/0300529 A1    Oct. 9, 2014

(30) Foreign Application Priority Data

Apr. 3, 2013 (KR) .................. 10-2013-0036536

(51) Int. Cl.
*H01L 27/32* (2006.01)
*G09G 3/32* (2016.01)

(52) U.S. Cl.
CPC ............ *H01L 27/326* (2013.01); *G09G 3/3233* (2013.01); *H01L 27/3216* (2013.01); *H01L 27/3218* (2013.01); *H01L 27/3262* (2013.01); *H01L 27/3265* (2013.01); *G09G 2300/0426* (2013.01); *G09G 2380/02* (2013.01); *H01L 2251/5338* (2013.01)

(58) Field of Classification Search
CPC .................. G06F 2203/04102; G09G 2380/02
USPC ........................................................ 345/204
See application file for complete search history.

(56) References Cited

U.S. PATENT DOCUMENTS

| | | | | |
|---|---|---|---|---|
| 2007/0262916 | A1* | 11/2007 | Kee ..................... | G02F 1/13336 345/1.3 |
| 2010/0142029 | A1* | 6/2010 | Touwslager ...... | G02F 1/133305 359/296 |
| 2011/0298691 | A1* | 12/2011 | DeLuca .................. | G06F 21/36 345/1.3 |
| 2012/0313862 | A1* | 12/2012 | Ko et al. ...................... | 345/173 |

FOREIGN PATENT DOCUMENTS

| | | | |
|---|---|---|---|
| JP | 2003-005204 A | | 1/2003 |
| JP | 2003022037 | * | 1/2003 |
| JP | 2003022037 A | * | 1/2003 |
| KR | 10-2006-0093952 A | | 2/2005 |
| KR | 10-2009-0036870 A | | 10/2007 |
| WO | WO 0204838 | * | 5/2002 |
| WO | WO 0242838 A1 | * | 5/2002 |
| WO | WO 03052825 | * | 6/2003 |
| WO | WO 03052825 A1 | * | 6/2003 |

* cited by examiner

*Primary Examiner* — Ilana Spar
*Assistant Examiner* — Jeffrey S Steinberg
(74) *Attorney, Agent, or Firm* — Lee & Morse, P.C.

(57) ABSTRACT

A foldable display device includes display panel and a driving circuit on a flexible substrate. The display panel includes at least one bendable area and a flat area. The flat area substantially maintains a same shape when the bendable area is bent. The bendable area has a different configuration of pixels or pixel circuits from the flat area.

21 Claims, 9 Drawing Sheets

FOLDABLE DISPLAY DEVICE

CROSS-REFERENCE TO RELATED APPLICATION

Korean Patent Application No. 10-2013-0036536, filed on Apr. 3, 2013, and entitled, "Foldable Display Device," is incorporated by reference herein in its entirety.

BACKGROUND

1. Field

One or more embodiments described herein relate to a display device.

2. Description of the Related Art

A foldable display device has been proposed which uses a flexible display panel. This type of devices is easily portable in its folded state and may open into a relatively large screen in its unfolded state. As such, a foldable display device may be have various applications in, for example, televisions, monitors, and mobile equipment. Examples of mobile equipment that may include a foldable display include mobile telephones, ultra-mobile PCs, electronic books, and electronic newspapers.

SUMMARY

In accordance with one embodiment, a foldable display device includes a flexible substrate; a driving circuit on the flexible substrate and including a thin film transistor and a capacitor; and a display panel on the flexible substrate and coupled to the driving circuit. The display panel includes at least one bendable area and a flat area. The flat area substantially maintains a same shape when the bendable area is bent. The bendable area has a different configuration of pixels or pixel circuits from the flat area.

The pixels in the bendable area and the pixels in the flat area may have different sizes. The pixels in the bendable area may be smaller than the pixels in the flat area.

A pitch between the pixels in the bendable area may be different from a pitch between the pixels in the flat area.

At least one element of pixel circuits in the bendable area may have a different size from at least a corresponding element of pixels circuits in the flat area. The at least one element may be a thin film transistor and/or a capacitor. The at least one element may be at least two capacitors in the bendable area.

Each pixel of the display panel includes red (R), green (G), and blue (B) sub-pixels, and at least two of the R, G, or B sub-pixels may have sizes in the bendable area different from sizes of at least two of the R, G, or B sub-pixels in the flat area. At least two of the R, G, or B sub-pixels in the bendable area and in the flat area may have different thicknesses. The display panel may include an organic light emitting diode.

Also, the at least one bendable area may include multiple bendable areas that are spaced from one another.

Stated differently, a display device includes a first area; a second area; and at least one third area between the first and second areas, wherein the third area bends relative to the first and second areas and wherein the third area includes a different configuration of pixels or pixel circuits from the first and second areas.

The third area may include a different pattern of pixels from the first and second areas. A spacing between the pixels in the third area may be different from a spacing between the pixels in the first and second areas. A size of the pixels in the third area is different from a size of the pixels in the first and second areas.

At least one element of the pixel circuits in the third area may have a different configuration from at least one corresponding element of the pixel circuits in the first and second areas. A size of at least one sub-pixel in the third area may be different from a size of at least one corresponding sub-pixel in each of the first and second areas.

The third area may bend to allow the first and second areas to overlap.

The at least one third area may include a plurality of third areas between the first and second areas, and the plurality of third areas may be spaced from one another.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
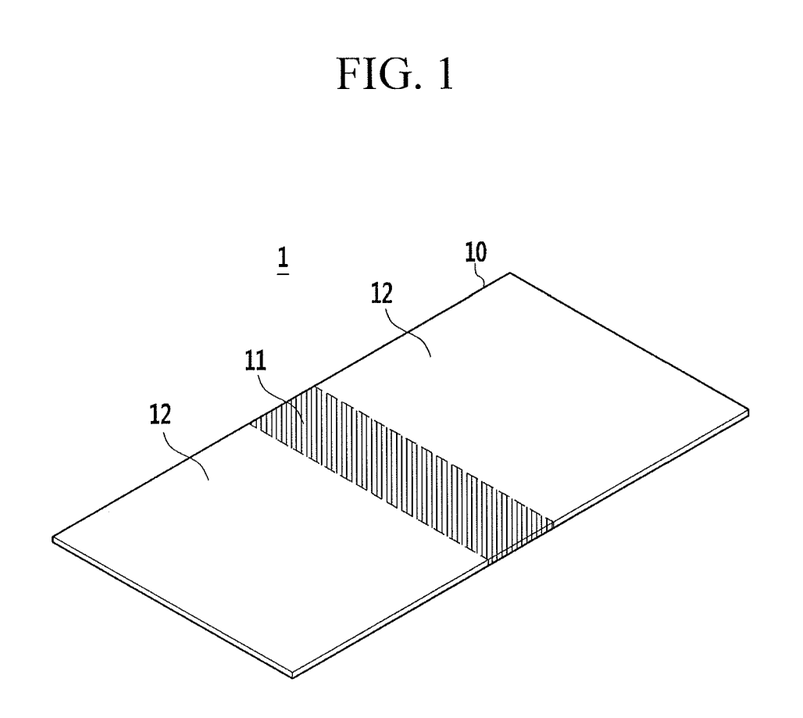
FIG. 1 illustrates an embodiment of a display panel of a foldable display device.
Figure 2:
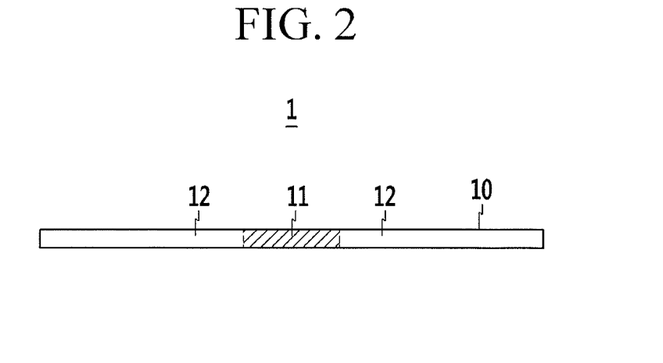
FIG. 2 illustrates an unfolded state of the display panel.
Figure 3:
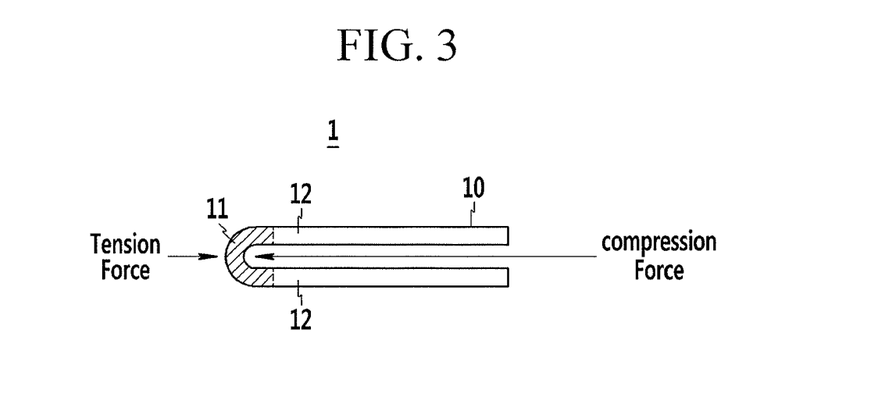
FIG. 3 illustrates a folded state of the display panel.

FIG. 1 illustrates an embodiment of a display panel 10 of a foldable display device 1, FIG. 2 illustrates a front view of the display panel 10 in an unfolded state, and FIG. 3 illustrates a front view of the display panel 10 in a folded state.

Referring to FIG. 1 to FIG. 3, the foldable display device 1 includes a display panel 10 including a flexible substrate 40 (see FIGS. 6 and 7), a driving circuit formed on the flexible substrate and including a thin film transistor and a capacitor (see FIGS. 4, 5, and 6), and a display (see FIGS. 4-8) formed on the flexible substrate and connected to the driving circuit.

The display panel 10 may be partitioned into a bendable area 11 and flat areas 12, e.g., first and second flat areas. The bendable area 11 is formed along a direction of a line that is bent on a center portion of the display panel 10. The bendable area 11 corresponds to an area to which a tension force and a compressive force are applied and which bends when the display panel 10 is folded. Flat areas 12 are symmetrically formed on respective sides of the bendable area 11. When the display panel 10 bends, the flat areas 12 maintain substantially their original shape (e.g., flat or planar) and therefore do not bend. As shown in FIG. 3, when the display panel 10 is folded, the surface of an outer portion of the bent area 11 expands and thereby receives a tension force. Conversely, the surface of an inner portion of the bent area 11 contracts and thereby receives a compression force. A result, the bendable area 11 has a substantially curved or U-type shape in the folded state.

In one embodiment, the bendable area 11 may bend within a first range of angles to allow flat areas to overlap one another in the folded state. In another embodiment, the bendable area may bend within a second range of angles different from the first range of angles. For example, the second range of angles may be smaller than the first range of angles. In one embodiment, the second range may be sufficient small to prevent the flat areas from overlapping one another, e.g., the angle between the flat areas may be a perpendicular or obtuse angle.

The display panel 10 may include one or more organic light emitting diodes, and therefore may be an organic light emitting diode (OLED) display. In other embodiments, the display panel 10 may generate light and images using another type of technology.

As previously mentioned, the display panel 10 may include a driving circuit on the flexible substrate, and an encapsulation thin film layer for encapsulating the one or more organic light emitting diodes. The flexible substrate may be made of a flexible plastic material. In other embodiments, the flexible substrate may be a metallic substrate made of stainless steel or another flexible material. For example, the flexible substrate may be made of plastic with excellent thermal resistance and durability. Examples include but are not limited to polyethylene ether phthalate, polyethylene naphthalate, polycarbonate, polyarylate, polyetherimide, polyether sulfone, and polyimide.

The driving circuit may include a thin film transistor and may drive the organic light emitting diode(s). The organic light emitting diode(s) is/are connected to the driving circuit and emit light according to a driving signal provided by the driving circuit to display an image.

The encapsulation thin film layer may be formed on the flexible substrate to cover the organic light emitting diode(s) and the driving circuit. The encapsulation film may be made of, for example, a plurality of inorganic layers or a mixture of inorganic layers.

In accordance with one embodiment, the display panel 10 may be formed to have an asymmetric design with respect to bendable area 11 and flat areas 12. In some flexible display panels, repeated folding and unfolding may cause a bent portion to deform. Also, characteristics of the circuits of the display panel can change or otherwise be adversely affected. In order to prevent these effects, the pixel(s), the thin film transistor, and the capacitor in the bendable area 11 and flat areas 12 can be asymmetrically designed.

Figure 4:
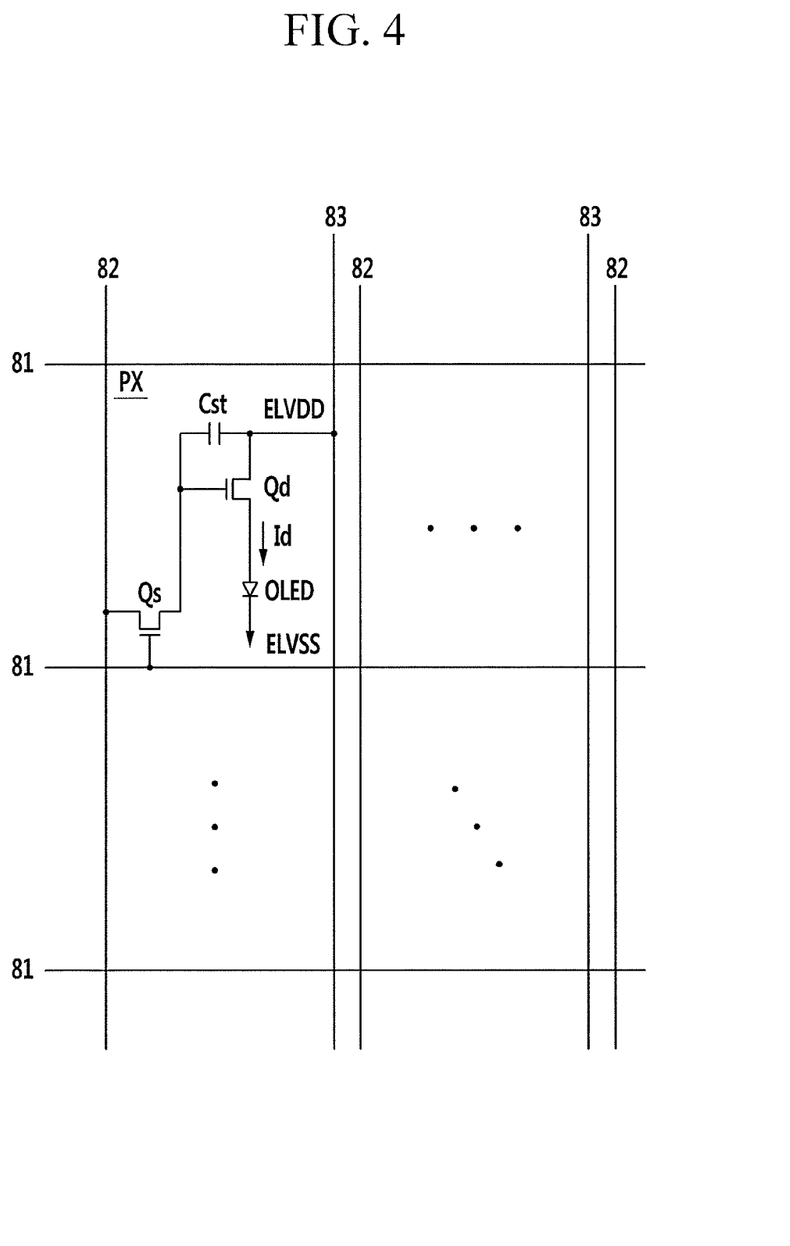
FIG. 4 illustrates an example of an equivalent circuit of the foldable display device.

FIG. 4 illustrates an embodiment of an equivalent circuit of the foldable display device 1. Referring to FIG. 4, the foldable display device 1 includes a plurality of signal lines 81, 82, and 83, and a plurality of pixels (one of which is illustratively shown as PX) connected to the signal lines and arranged in matrix form.

The signal lines include a plurality of gate lines 81 for transmitting a scan signal (or a gate signal), a plurality of data lines 82 for transmitting a data signal, and a plurality of driving voltage lines 83 for transmitting a driving voltage. The gate lines 81 may extend substantially in a row direction and may be substantially in parallel with each other. The data lines 82 and the driving voltage lines 83 may extend substantially in a column direction and may be substantially parallel with each other. In other embodiments, the signal lines may be arranged differently and/or one or more different types of signal lines may be used.

The pixels (PX) may respectively include a switching thin film transistor (Qs), a driving thin film transistor (Qd), a storage capacitor (Cst), and an organic light emitting diode (OLED).

The switching thin film transistor (Qs) includes a control terminal, an input terminal, and an output terminal. In one embodiment, the control terminal is connected to the gate line 81, the input terminal is connected to the data line 82, and the output terminal is connected to the driving thin film transistor (Qd). In operation, the switching thin film transistor (Qs) responds to the scan signal applied to the gate line 81 and transmits the data signal applied to the data line 82 to the driving thin film transistor (Qd).

The driving thin film transistor (Qd) may include a control terminal, an input terminal, and an output terminal. In one embodiment, the control terminal is connected to the switching thin film transistor (Qs), the input terminal is connected to the driving voltage line 83, and the output terminal is connected to the organic light emitting diode (OLED). The driving thin film transistor (Qd) outputs an output current (Id) which is variable based on the voltage between the control terminal and the output terminal.

The storage capacitor (Cst) is connected between the control terminal of the driving thin film transistor (Qd) and the input terminal. The storage capacitor (Cst) charges based on the data signal applied to the control terminal of the driving thin film transistor (Qd), and maintains a charged state when the switching thin film transistor (Qs) is turned off.

The organic light emitting diode (OLED) includes an anode connected to the output terminal of the driving thin film transistor (Qd) and a cathode connected to the common voltage (ELVSS). The organic light emitting diode (OLED) emits light to display an image. The amount of light emitted is based on changes in the intensity of the output current (Id) of the driving thin film transistor (Qd).

The switching thin film transistor (Qs) and the driving thin film transistor (Qd) may be, for example, n-channel field effect transistors (FETs). At least one of the switching thin film transistor (Qs) or the driving thin film transistor (Qd) may be a p-channel field effect transistor. In other embodiments, the thin film transistors (Qs) and (Qd), the capacitor (Cst), and the organic light emitting diode (OLED) may be connected in a different arrangement than as illustrated in FIG. 4.

Figure 5:
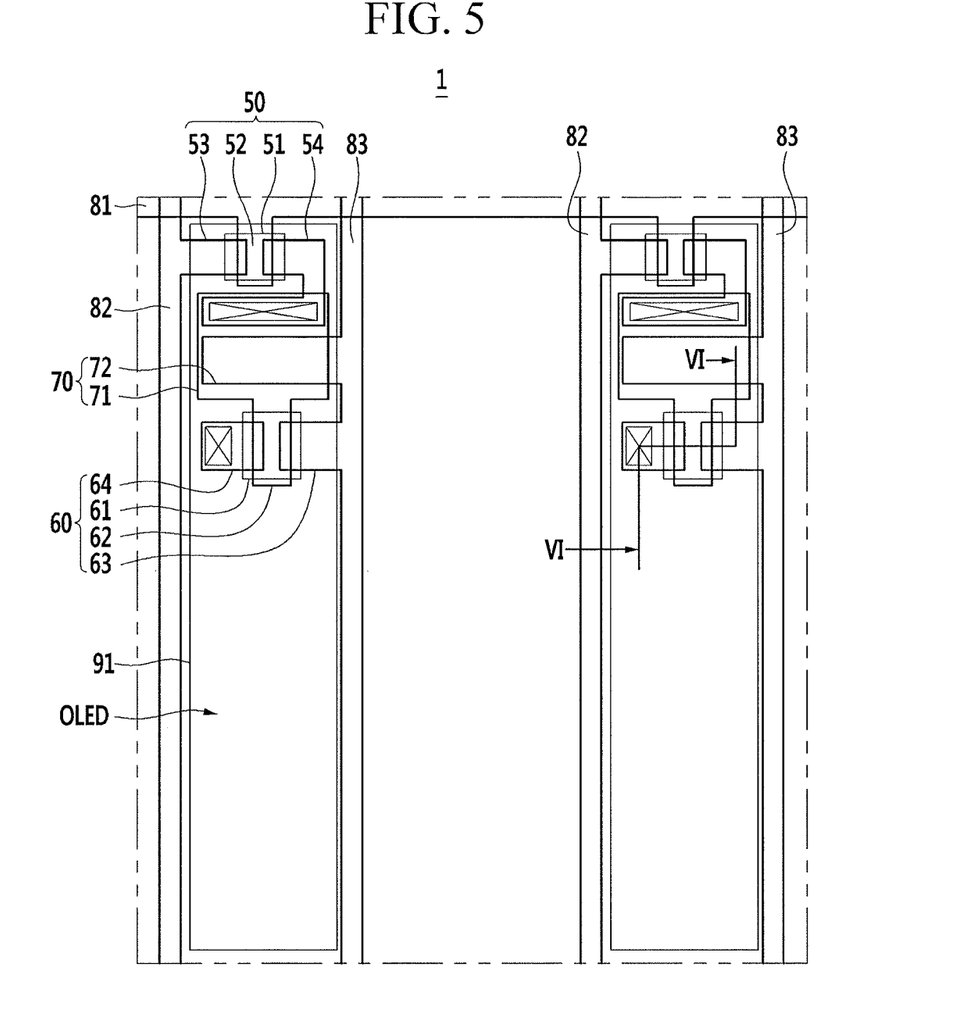
FIG. 5 illustrates an embodiment of a pixel configuration of the display panel.
Figure 6:
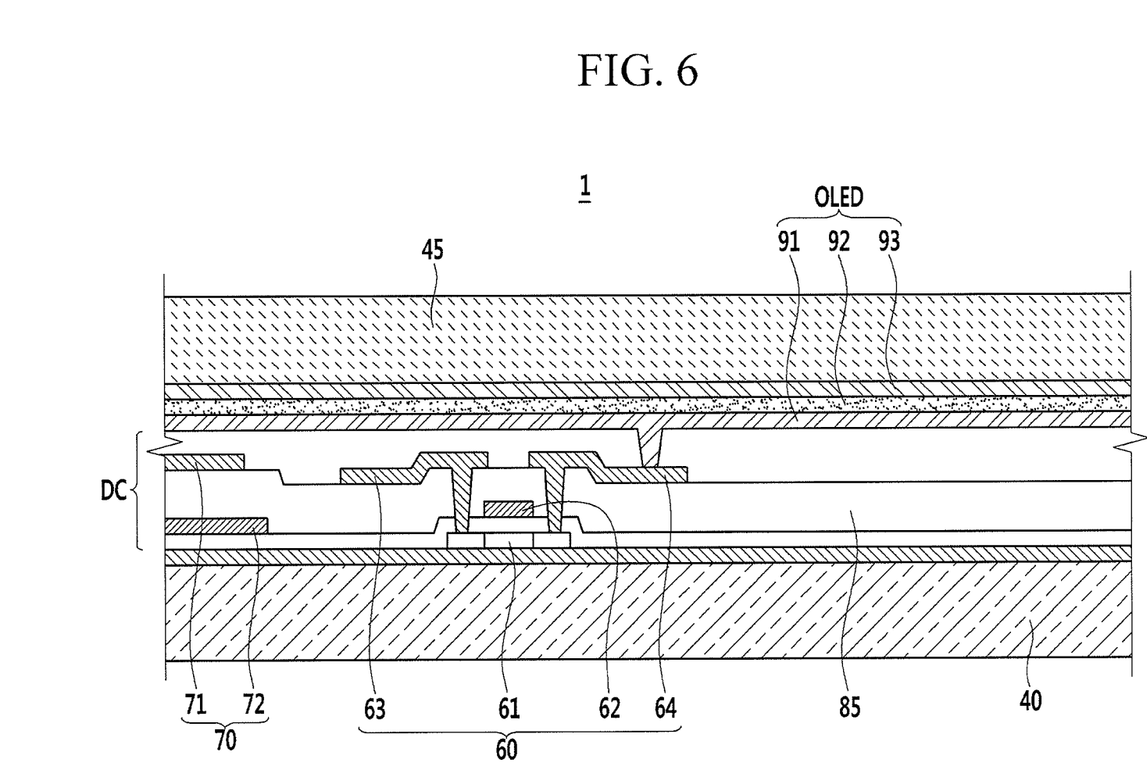
FIG. 6 illustrates the display panel taken along section line VI-VI of FIG. 5.

FIG. 5 illustrates an example of one possible layout of a pixel configuration of the display panel 10 of the foldable display device 1. FIG. 6 illustrates a cross-section of the display panel 10 taken along section line VI-VI of FIG. 5.

Referring to FIGS. 5 and 6, the flexible display panel 10 includes a pixel circuit (DC) formed and an organic light emitting diode (OLED) for a corresponding pixel (PX). The pixel circuit (DC) includes a switching thin film transistor 50, a driving thin film transistor 60, and a capacitor 70. The flexible display panel 10 also includes a gate line 81 disposed in a first direction, a data line 82 crossing the gate line 81 in an insulated manner, and a driving voltage line 83.

As shown, one pixel (PX) is defined by or within an area bounded by the gate line 81, the data line 82, and the driving voltage line 83. The pixel (PX) represents a basic unit for displaying an image, and the flexible display panel 10 uses a plurality of pixels (PX) to display the image.

FIG. 5 illustrates a 2Tr-1Cap-based active matrix-type flexible display panel 10. This type of panel has two thin film transistors 50 and 60 and one capacitor 70 for each pixel (PX). The flexible display panel 10 may be of a different type (e.g., passive type) or may have a different configuration in other embodiments. In one embodiment, the flexible display panel 10 includes at least three thin film transistors and at least two capacitors. An additional wire may be formed thereon to realize different configurations.

The organic light emitting diode (OLED) includes a pixel electrode 91, an organic emission layer 92, and a common electrode 93. One of the pixel electrode 91 or the common electrode 93 may be a hole injection electrode and the other may be an electron injection electrode. Electrons and holes are injected into the organic emission layer 92 from the pixel electrode 91 and the common electrode 93. Light is emitted when excitons, generated by combinations of holes and electrons, enter the ground state from the excitation state.

Figure 7:
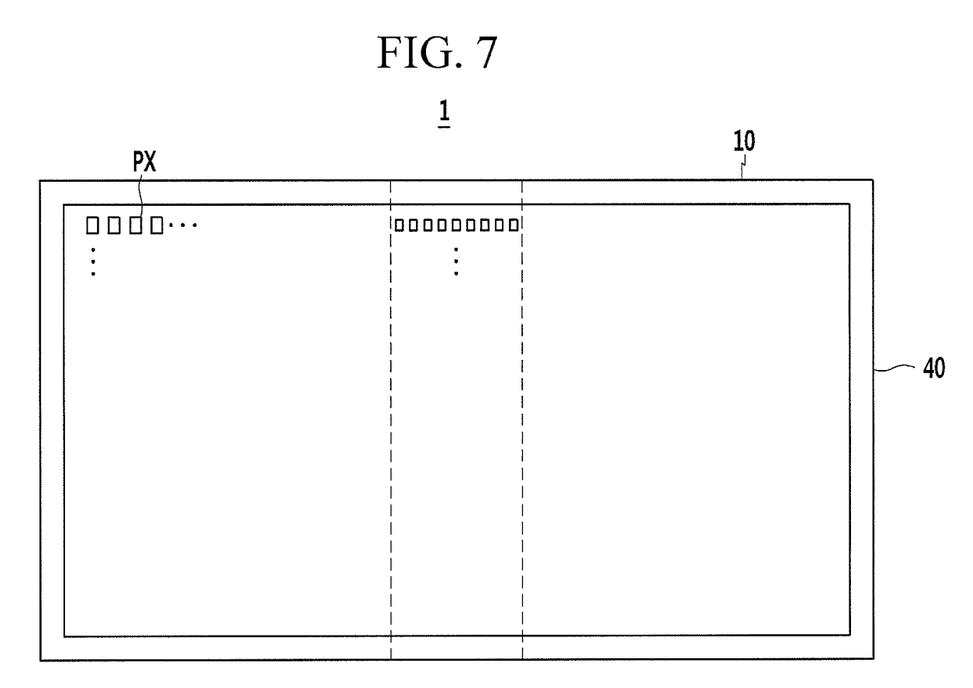
FIG. 7 illustrates an example of a top view of the foldable display device.

The pixel electrode 91 may be made of a metal with great reflectivity, and the common electrode 93 may be made of a transparent conductive layer. In this case, light of the organic emission layer 92 is reflected by the pixel electrode 91 and is then transmitted through the common electrode 93 and a thin-film encapsulation layer 45. Reference numeral 40 in FIGS. 6 and 7 represent a flexible substrate.

The capacitor 70 includes a pair of capacitor electrodes 71 and 72 and an interlayer insulating layer 85 between the pair of capacitor electrodes 71 and 72. The interlayer insulating layer may be made of a dielectric material. The charges stored in the capacitor 70 and the voltage between the capacitor electrodes 71 and 72 determine capacitance.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching thin film transistor 50 is used as a switch for selecting a pixel to emit light. The switching gate electrode 52 is connected to the gate line 81. The switching source electrode 53 is connected to the data line 82, and the switching drain electrode 54 is connected to one capacitor electrode 71.

The driving thin film transistor 60 applies a driving power voltage, for generating light emission from the organic emission layer 92 of the selected pixel, to the pixel electrode 91. The driving gate electrode 62 is connected to the capacitor electrode 71, which is connected to the switching drain electrode 54. The driving source electrode 63 and the other capacitor electrode 72 are connected to the driving voltage line 83. The driving drain electrode 64 is connected to the pixel electrode 91 of the organic light emitting diode (OLED) through a contact hole.

The switching thin film transistor 50 is operated by the gate voltage applied to the gate line 81. The switching film transistor 50 transmits the data voltage applied to the data line 82 to the driving thin film transistor 60. A voltage that corresponds to a difference between the common voltage (applied to the driving thin film transistor 60 from the driving voltage line 83) and the data voltage (provided by the switching thin film transistor 50) is stored in the capacitor 70. A current that corresponds to the voltage stored in the capacitor 70 flows to the organic light emitting diode (OLED) through the driving thin film transistor 60, to cause light emission from the organic emission layer 92.

The thin-film encapsulation layer 45 may be formed with a configuration in which at least one organic layer and at least one inorganic layer are alternately stacked. The organic layer may be made of a polymer. For example, the organic layer may be a single layer or a stacked layer formed with at least one of polyethylene terephthalate, polyimide, polycarbonate, epoxy, polyethylene, or polyacrylate. The inorganic layer may be a single layer or a stacked layer including a metal oxide or a metal nitride. For example, the inorganic layer may include at least one of $SiN_x$, $Al_2O_3$, $SiO_2$, or $TiO_2$. A highest layer that is externally exposed and formed on the thin-film encapsulation layer 45 may be an inorganic layer to prevent permeation of moisture into the organic light emitting diode (OLED).

As shown in FIG. 7, the pixels (PX) of the display panel 10, as shown in FIG. 4 to FIG. 6, may have different sizes in the bendable area 11 and the flat areas 12. For example, the pixels in the bendable area 11 may be formed to be smaller than the pixels in the flat areas 12.

The switching thin film transistor 50 and the driving thin film transistor 60 may have different sizes in the bendable area 11 and the flat areas 12. For example, the size of the thin film transistor in the bendable area 11 may be smaller than in the flat areas 12 to prevent the characteristics of the thin film transistors in the bendable area 11 from changing in the folded state, e.g., when tension and compression forces are applied to different surfaces of the bendable area 11 when in the folded state. For example, when the width/length ratio of the thin film transistors in the flat areas 12 is 10/8, the width/length ratio of the thin film transistors in the bendable area 11 may be 9/8. Of course, these ratios may be different in other embodiments.

In accordance with one embodiment, two sizes of thin film transistors may be used. For example, when the width/length ratio of the thin film transistors in the flat areas 12 is 20/5, the width/length ratio of the thin film transistors in the bendable area 11 may be 5/5 with four thin film transistors for the purpose of distributing the tension force.

The capacitors 70 shown in FIG. 4 to FIG. 6 can be formed to have different sizes in the bendable area 11 and the flat areas 12. When the display panel 10 in the folded state, the distance between the capacitor electrodes 71 and 72 may be varied and a charging amount of the capacitor 70 may therefore not be constant but may change. Therefore, when the width and the length of the capacitor electrodes 71 and 72 are subdivided and the capacitor 70 is divided into at least two thereof in the bendable area 11, the change of the charging amount may be reduced or minimized.

FIG. 7 illustrates an example of a top plan view of display panel 10 of the foldable display device 1. Referring to FIG. 7, a plurality of pixels (PX) configured with organic light emitting diodes are formed in the bendable area 11 and the flat areas 12 on the flexible substrate 40. The pixels (PXs) in the bendable area 11 may be smaller than the pixels (PXs) in the flat areas 12. Further, a pitch (or interval distance) between the pixels (PXs) in the bendable area 11 may be less than the pitch (or interval distance) between the pixels (PXs) in the flat areas 12.

Figure 8:
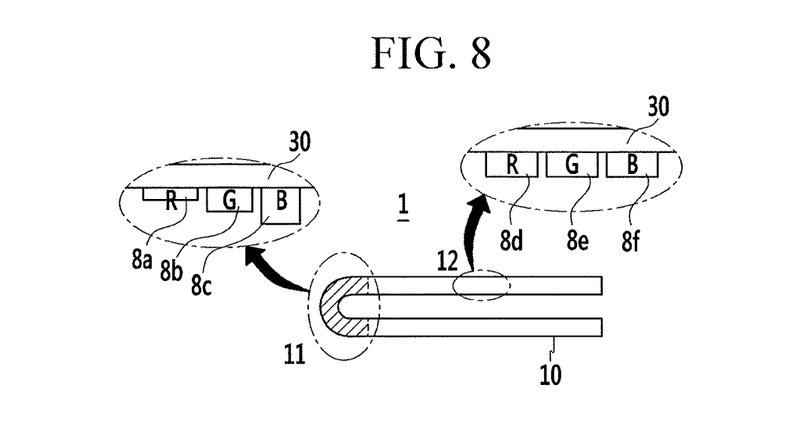
FIG. 8 illustrates an embodiment of R, G, and B sub-pixels of the display device.

FIG. 8 illustrates one example arrangement red (R), green (G), and blue (B) sub-pixels of the display panel 10. In this embodiment, the display panel 10 includes sub-pixels 8a, 8b, 8c, 8d, 8e, and 8f formed on the transparent electrode 30. The sub-pixels 8a, 8b, and 8c in the bendable area 11 have different sizes from the sub-pixels 8d, 8e, and 8f in one or both of the flat areas 12. Also, the red (R), green (G), and blue (B) sub-pixels 8a, 8b, and 8c in the bendable area 11 have different thicknesses and/or areas from the sub-pixels in one or both of the flat areas 12. For example, the R sub-pixel 8a may have the greatest area and the B sub-pixel 8c can be formed to have the greatest thickness from among the sub-pixels 8a, 8b, and 8c in the bendable area 11. The G sub-pixel may have an area and/or thickness therebetween.

In other embodiments, pixels in the bendable area 11 may have a different size than pixels in the flat areas 12. For example, the pixels in the bendable area 11 may differ in terms of width, length, thickness, arrangement, and/or spacing from the pixels in the flat areas 12. Also, the spacing between the pixels may differ in one or more directions. Also, the pattern of pixels or sub-pixels in the bendable area 11 may be different from the pattern of pixels or sub-pixels in the flat areas 12.

Figure 9:
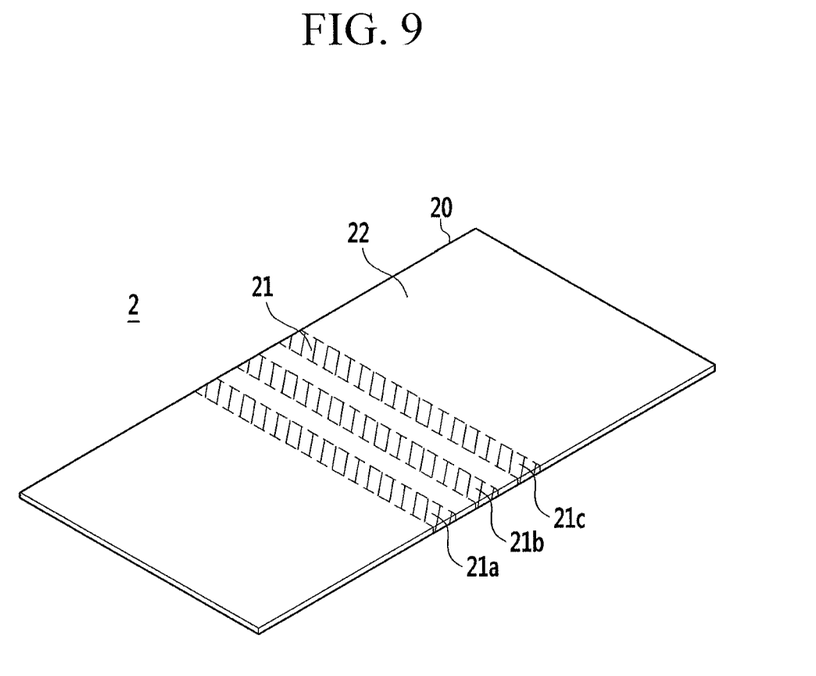
FIG. 9 illustrates another embodiment of a display panel of a foldable display device.
Figure 10:
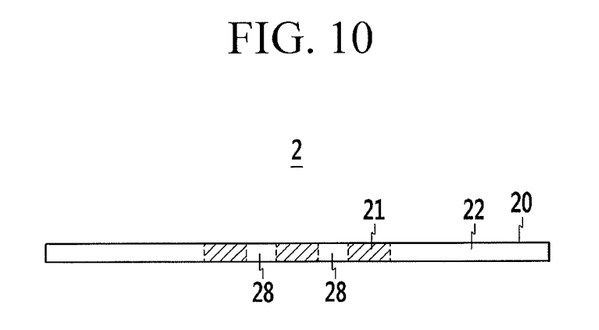
FIG. 10 illustrates an unfolded state of the display panel of FIG. 9.
Figure 11:
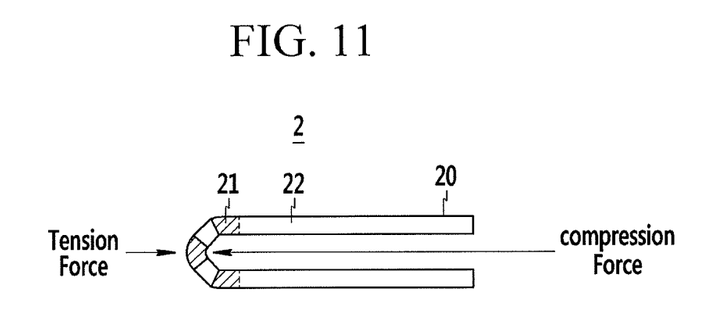
FIG. 11 illustrates a folded state of the display panel of FIG. 9.

FIG. 9 illustrates another embodiment of a display panel 20 of a foldable display device 2, FIG. 10 illustrates display panel 20 in an unfolded state, and FIG. 11 illustrates display panel 20 in a folded state.

Referring to FIG. 9 to FIG. 11, display panel 20 includes multiple bendable areas 21 formed in a direction parallel to the fold. The bendable areas 21 may include one bendable area 21b in a center area of the display panel 20 and additional bendable areas 21a and 21c formed symmetrically and on respective sides of bendable area 21b. The bendable areas 21 represent areas to which a tension force and a compressive force are applied on outer and inner surfaces, respectively, when the display panel 20 is in the folded state. The flat area 22 represents an area which maintains its shape (e.g., flat) in both the folded and unfolded states. As shown in FIG. 11, when the display panel 20 is in the folded state, outer sides of the bendable areas 21 receive a tension force and their surfaces expand, and inner sides receive a compression force and their surfaces contract.

The foldable display panel shown in FIG. 9 to FIG. 11 may have the same configuration as the foldable display device shown in FIG. 1 to FIG. 8, except that a plurality of bendable areas 21 are formed on the display panel 20. The areas 28 between the bendable areas 21 may be less bendable or rigid areas which may include pixels and pixel circuits as described above. The sizes and ratios of the pixels and pixel circuit elements in areas 28 may be the same or different from the sizes and ratios of the pixels and pixel circuit elements in bendable areas 21 and/or flat areas 22.

By way of summation and review, when folded, different portions of the flexible display panel may experience different forces. For example, an inner portion of a folded part of the flexible display panel may receive a compressive force which causes it to contract. Conversely, an outer portion of the folded part may receive a tension force which causes it to expand. When the display device is repeatedly folded and unfolded many times, the forces applied to the inner and outer portions of the folded part may cause stain or stress which results in deformation.

This deformation may occur even when a material with excellent resiliency is used as a material of the flexible display panel. For example, when such a material is repeatedly folded and unfolded for several tens of thousands of times, it may deform because of stress and/or a change in an arrangement of polymers supporting the outer portion. Also, the color of the polymers may change under these circumstances.

Further, a characteristic of a thin film transistor (TFT) and a characteristic of a capacitor of the display panel can change. Therefore, the flexible display panel may be easily damaged and its durability may be deteriorated.

In accordance with one or more embodiments, a foldable display panel is provided with improved image quality and reliability. The foldable display panel may prevent characteristics of the thin film transistor and the capacitors of the panel from changing in folded and unfolded states by asymmetrically designing one or more of the thin film transistors, the capacitors, or other pixel circuit elements in one or more bendable areas and the flat areas of the display panel. This asymmetrical design ay prevent deformation of the display panel. Further, in accordance with one embodiment, the pixels and the sub-pixels may be asymmetrically designed in the one or more bendable areas and in the flat areas of the display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A foldable display device comprising:
   a flexible substrate;
   a driving circuit on the flexible substrate and including a thin film transistor and a capacitor; and
   a display panel on the flexible substrate and coupled to the driving circuit, the display panel including:
   at least one bendable area that changes between a first shape and a second shape, the bendable area having the first shape when unbent and having a curved shape when bent; and
   a flat area that substantially maintains a same shape when the bendable area is bent, wherein the bendable area has a different configuration of pixels or pixel circuits from the flat area.

2. The foldable display device as claimed in claim 1, wherein the pixels in the bendable area and the pixels in the flat area have different sizes.

3. The foldable display device as claimed in claim 2, wherein the pixels in the bendable area are smaller than the pixels in the flat area.

4. The foldable display device as claimed in claim 3, wherein a pitch between the pixels in the bendable area is different from a pitch between the pixels in the flat area.

5. The foldable display device as claimed in claim 1, wherein at least one element of pixel circuits in the bendable area has a different size from at least a corresponding element of pixels circuits in the flat area.

6. The foldable display device as claimed in claim 5, wherein the at least one element is a thin film transistor.

7. The foldable display device as claimed in claim 5, wherein the at least one element is a capacitor.

8. The foldable display device as claimed in claim 5, wherein the at least one element is at least two capacitors in the bendable area.

9. The foldable display device as claimed in claim 1, wherein:
   each pixel of the display panel includes red (R), green (G), and blue (B) sub-pixels, and
   at least two of the R, G, or B sub-pixels have sizes in the bendable area different from sizes of at least two of the R, G, or B sub-pixels in the flat area.

10. The foldable display device as claimed in claim 9, wherein at least two of the R, G, or B sub-pixels in the bendable area and in the flat area have different thicknesses.

11. The foldable display device as claimed in claim 1, wherein the display panel includes an organic light emitting diode.

12. The foldable display device as claimed in claim 1, wherein:
   the at least one bendable area includes multiple bendable areas, and
   the multiple bendable areas are spaced from one another.

13. A display device, comprising:
   a first area;
   a second area; and
   at least one third area between the first and second areas, wherein the third area changes between a first shape and a second shape, the third area having the first shape when unbent and having a curved shape when bent relative to the first and second areas and wherein the third area includes a different configuration of pixels or pixel circuits from the first and second areas.

14. The display device as claimed in claim 13, wherein the third area includes a different pattern of pixels from the first and second areas.

15. The display device as claimed in claim 14, wherein a spacing between the pixels in the third area is different from a spacing between the pixels in the first and second areas.

16. The display device as claimed in claim 13, wherein a size of the pixels in the third area is different from a size of the pixels in the first and second areas.

17. The display device as claimed in claim 13, wherein at least one element of the pixel circuits in the third area has a different configuration from at least one corresponding element of the pixel circuits in the first and second areas.

18. The display device as claimed in claim 13, wherein a size of at least one sub-pixel in the third area is different from a size of at least one corresponding sub-pixel in each of the first and second areas.

19. The display device as claimed in claim 13, wherein the third area bends to allow the first and second areas to overlap.

20. The display device as claimed in claim 13, wherein:
   the at least one third area includes a plurality of third areas between the first and second areas, and
   the plurality of third areas spaced from one another.

21. The foldable display device as claimed in claim 1, wherein:
   the flat area has a first flat section and a second flat section, and
   the at least one bendable area is between the first and second flat sections.

* * * * *